United States Patent
Kameda

(10) Patent No.: US 6,809,387 B2
(45) Date of Patent: Oct. 26, 2004

(54) POWER SWITCHING DEVICE

(75) Inventor: Mitsuhiro Kameda, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/410,408

(22) Filed: Apr. 10, 2003

(65) Prior Publication Data

US 2004/0155303 A1 Aug. 12, 2004

(30) Foreign Application Priority Data

Feb. 10, 2003 (JP) .......................... 2003-032308

(51) Int. Cl.[7] .................. H01L 29/76; H01L 29/94; H01L 31/062; H01L 31/113; H01L 31/119
(52) U.S. Cl. ........................... 257/393; 257/130
(58) Field of Search ................ 257/393, 903, 257/130, 115

(56) References Cited

U.S. PATENT DOCUMENTS 5,693,966 A   12/1997   Anazawa et al. ........... 257/207
6,653,697 B2 * 11/2003  Hidaka et al. .............. 257/393

FOREIGN PATENT DOCUMENTS

| JP | 6-216315   | 8/1994  |
|----|------------|---------|
| JP | 8-204183   | 8/1996  |
| JP | 8-274182   | 10/1996 |
| JP | 2002-16486 | 1/2002  |

* cited by examiner

*Primary Examiner*—Phat X. Cao
(74) *Attorney, Agent, or Firm*—Oblon, Spivak, McClelland, Maier & Neustadt, P.C.

(57) ABSTRACT

A power switching device comprises a semiconductor substrate; a plurality of cells, each of which switches a current from a power supply to a load on the basis of a potential at a gate electrode, said cells being arranged on said semiconductor substrate to form a cell array; and a plurality of drivers connected to the gate electrode, said plurality of drivers being distributively arranged in said cell array or being distributively arranged peripheral said cell array.

15 Claims, 7 Drawing Sheets

CT

TRANSFORMER

HALL IC

POWER SWITCHING DEVICE

CROSS-REFERENCE TO RELATED APPLICATION

This application is based upon and claims the benefit of priority from the prior Japanese Patent Application No. 2003-32308, filed on Feb. 10, 2003, the entire contents of which are incorporated herein by reference.

BACKGROUND OF THE INVENTION

1. Field of the Invention

The present invention relates to a power switching device.

2. Related Background Art

MIS (Metal Insulated Semiconductor) transistors, such as power MOSFETs and IGBTs (Insulated Gate Bipolar Transistors) are used in various electronic apparatuses such as power supplies and inverters.

FIG. 9 is a circuit diagram of a conventional DC—DC converter. A DC—DC converter 500 includes a power MOSFET $Q_1$ (hereafter also referred to as transistor $Q_1$) connected between an input IN and an output OUT. The transistor $Q_1$ is driven by a driver $DR_1$, which is controlled at a high frequency by a control circuit $IC_1$.

The DC—DC converter 500 further includes an inductor L, a capacitor $C_{in}$, and a capacitor $C_{out}$. The inductor L, the capacitor $C_{in}$ and the capacitor $C_{out}$ convert an input voltage $V_{in}$ to an output voltage $V_{out}$ by switching on or off the transistor $Q_1$.

The DC—DC converter 500 further includes a diode DI and a power MOSFET $Q_2$ (hereafter also referred to as transistor $Q_2$). The diode DI and the transistor $Q_2$ complement an output current of the DC—DC converter when the transistor $Q_1$ is switched from ON to OFF. When the transistor $Q_1$ is ON, therefore, the transistor $Q_2$ is OFF. When the transistor $Q_1$ is switched from ON to OFF, the transistor $Q_2$ is switched from OFF to ON. In other words, the DC—DC converter 500 is a DC—DC converter of synchronous commutation type. The transistor $Q_2$ is driven by a driver $DR_2$, which is controlled by a control circuit $IC_1$.

In the conventional transistor $Q_1$, all cells are driven by using one gate electrode. The transistor $Q_1$, has a large number of cells connected in parallel to each other in order to let a large current flow from the input to the output. Gate electrodes are provided respectively on these cells, and aluminum wiring is connected to gate electrodes. The aluminum wiring is connected to a bonding pad (not illustrated). By applying a voltage to the aluminum wiring via the bonding pad, the potential at the gate electrodes of all cells is changed. As a result, all cells are switched on or off. This means that the area of an activated cell region (hereafter referred to as activated region) depends upon the chip size and it is fixed.

For increasing the switching speed of the transistor $Q_1$, it is effective to decrease the resistance or inductance of the aluminum wiring. In the conventional technique, the width of aluminum wiring is made wider in fabrication, or a plurality of pieces of aluminum wiring have been fabricated, in order to reduce the resistance or inductance of aluminum wiring.

In the case where the resistance of the aluminum wiring is reduced, however, the driver $DR_1$, must let flow a large current. Therefore, the burden imposed on the driver $DR_1$, increases. In addition, in this case, a large current flows through the bonding wire to the gate electrode. Therefore, it becomes necessary to consider the resistance and inductance of the bonding wire.

Therefore, a power switching device capable of conducting switching at a high speed is desired.

SUMMARY OF THE INVENTION

A power switching device comprises a semiconductor substrate; a plurality of cells, each of which switches a current from a power supply to a load on the basis of a potential at a gate electrode, said cells being arranged on said semiconductor substrate to form a cell array; and a plurality of drivers connected to the gate electrode, said plurality of drivers being distributively arranged in said cell array or being distributively arranged peripheral said cell array.

A power switching device comprises a switching circuit including a semiconductor substrate, a plurality of cells, each of which switches a current from a power supply to a load on the basis of a potential at a gate electrode, said cells being arranged on said semiconductor substrate to form a cell array, and a plurality of drivers connected to the gate electrode, said a plurality of drivers being distributively arranged in said cell array or being distributively arranged peripheral said cell array; a control circuit to control said plurality of drivers; and a detection circuit to detect a current that flows through said switching circuit, said detection circuit feeding back a result of the detection to said control circuit.

A power switching device comprises a switching circuit including a semiconductor substrate, a plurality of cells, each of which switches a current from a power supply to a load on the basis of a potential at a gate electrode, said cells being arranged on said semiconductor substrate to form a cell array, and a plurality of drivers connected to the gate electrode, said a plurality of drivers being distributively arranged in said cell array or being distributively arranged peripheral said cell array; and a control circuit to control said plurality of drivers on the basis of an operation frequency of said switching circuit.

DETAILED DESCRIPTION OF THE INVENTION

Hereafter, embodiments according to the present invention will be described with reference to the drawings. These embodiments do not limit the present invention.

Figure 9:
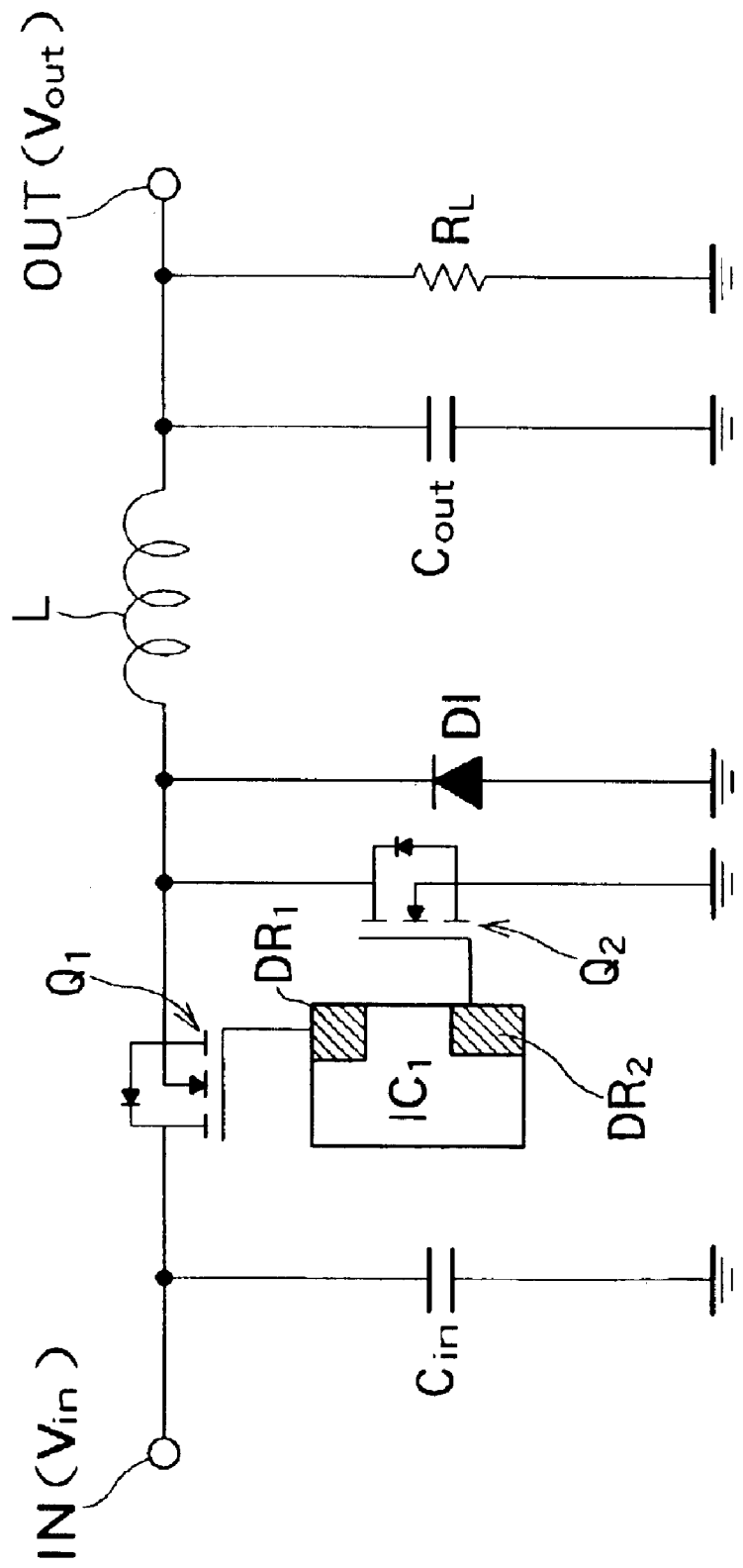
FIG. 9 is a circuit diagram of a conventional DC—DC converter.

In the conventional technique, a driver for driving a power switching device is provided in a control circuit (see $DR_1$ in FIG. 9). Embodiments according to the present invention have a plurality of drivers arranged distributively in or around a cell array of a power switching device. In the embodiments according to the present invention, therefore, it is possible to supply currents from a plurality of distributed points to a gate electrode and control the activated area of the cells.

Figure 1:
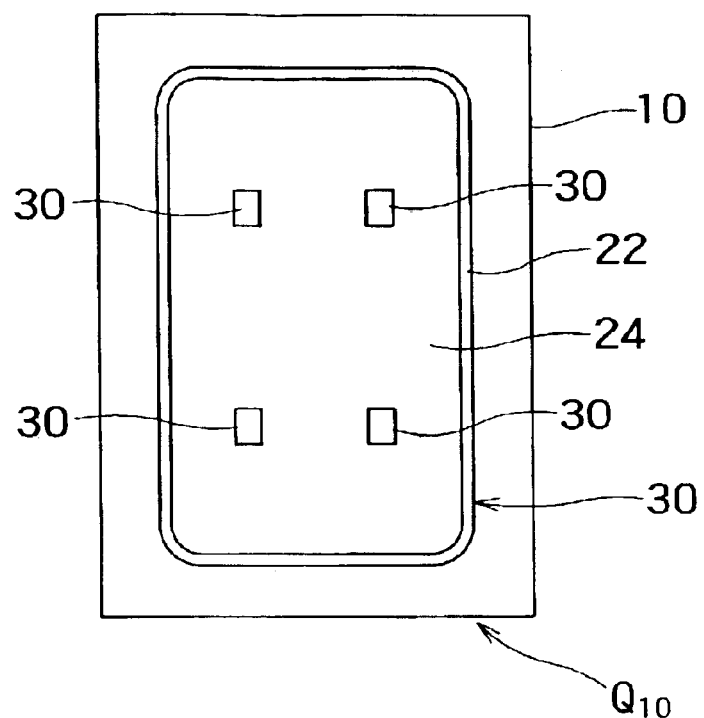
FIG. 1 is a top view showing a transistor $Q_{10}$ in a first embodiment of a power switching device according to the present invention.

FIG. 1 is a top view of a power MISFET $Q_{10}$ (hereafter referred to as transistor $Q_{10}$) in a first embodiment of a power switching device according to the present invention. The transistor $Q_{10}$ has a semiconductor chip 20 mounted on a frame 10. The semiconductor chip 20 includes a semiconductor substrate 22, a gate electrode 24, and a plurality of drivers 30. A plurality of cells are arranged and formed on the semiconductor substrate 22. Therefore, the plurality of cells form a cell array on the substrate 22. However, these cells are formed under the gate electrode 24, and consequently they are not illustrated.

The drivers 30 are connected to the gate electrode 24. If a gate signal is input to the drivers 30, the drivers 30 amplify the gate signal and supply gate currents to the gate electrode 24. As a result, the potential at the gate electrode 24 changes. Therefore, respective cells are switched, and a current can flow from a power supply to a load. Although a current each cell can let flow is small, the transistor $Q_{10}$ can let flow a large current by connecting a large number of cells in parallel.

According to the present embodiment, four drivers 30 are distributively arranged in an array composed of a plurality of cells. The drivers 30 are distributively and uniformly arranged on the surface of the semiconductor chip 20 without being biased forward or backward or to the left or right. In other words, the drivers 30 are arranged so as to make the center of gravity in the four drivers 30 nearly coincide with the center of gravity in all cells.

In the conventional transistor $Q_1$, a gate current is supplied from one point (from a bonding pad connected to the gate). According to the present embodiment, however, a plurality of drivers 30 are incorporated in the cell array. Therefore, the gate current can be supplied from a plurality of points on the gate electrode 24. Even if the gate electrode 24 of the transistor $Q_{10}$ has capacitance equal to that in the gate electrode of the transistor $Q_1$, therefore, the drivers 30 for the transistor $Q_{10}$ can raise the voltage at the gate electrode 24 rapidly. As a result, the transistor $Q_{10}$ becomes faster than the conventional transistor $Q_1$ in switching speed. In this case, however, the drivers 30 apply voltages to the gate electrode 24 at the same timing.

Since the gate currents are supplied from the points to the gate electrode 24, the inductance of the gate electrode 24 is lowered. As a result, the operation of the electronic apparatus is stabilized. Furthermore, since the drivers 30 are distributively arranged, the distance between the point where the current is supplied to the gate electrode 24 and each cell becomes short. As a result, the resistance and inductance of aluminum wiring are reduced. In general, the gate resistance and inductance of the power MISFET are caused by aluminum wiring between the driver 30 and the gate electrode 24. By reducing the resistance and inductance of the aluminum wiring, therefore, the gate resistance and inductance of the power MISFET are reduced. As a result, the switching speed of the transistor $Q_{10}$ is increased.

In the present embodiment, the gate current is supplied from a plurality of points on the gate electrode 24, and consequently the gate current is distributed among the drivers 30. Therefore, a large current is not concentrated to a single driver 30, and the burden imposed on each driver 30 is smaller than that in the conventional technique. In addition, since the drivers 30 are arranged uniformly and distributively in the cell array, nearly equal currents flow through the drivers 30. Only the signal current flows through the bonding wire, and the large current obtained after the amplification does not flow through the bonding wire. Therefore, it is not necessary to consider the resistance and inductance of the bonding wire. In addition, the respective distances between the plurality of drivers 30 and the cells can be shortened as compared with the conventional technique. Therefore, the resistance and inductance of the aluminum winding are reduced. As a result, the switching speed of the transistor $Q_{10}$ becomes faster than that in the conventional technique. A faster switching speed means a shorter switching time $t_{sw}$. Therefore, a switching loss represented by expression (2) later is lowered.

Furthermore, according to the present embodiment, the plurality of drivers 30 can be controlled at different times. As a result, the drivers 30 can control currents to the gate electrode 24 and alter the rise speed or the fall speed of the gate voltage. For example, in the beginning of the potential fall at the gate electrode 24, a control circuit IC shown in FIG. 5 activates all drivers 30. Since the amplification factor of the gate currents is comparatively large, therefore, the potential at the gate electrode 24 falls comparatively rapidly. Thereafter, immediately before the potential fall at the gate electrode 24 is completed, the control circuit IC decreases the number of activated drivers 30. As a result, the amplification factor of the gate current becomes comparatively small. Therefore, the potential at the gate electrode 24 falls comparatively slowly. By thus making the potential at the gate electrode 24 fall comparatively slowly immediately before the falling is completed, the switching speed is suppressed. As a result, the switching noise is reduced. On the other hand, since the potential at the gate electrode 24 is lowered in the beginning of the potential fall at the gate electrode 24, the time when the switching loss occurs is nearly the same as that in the conventional switching operation. The degree of the fall in the switching speed is smaller than that in the conventional technique.

As for the potential rise at the gate electrode 24 as well, it is possible to reduce the switching noise while suppressing the lowering in the switching speed to some extent, in the same way as its potential fall.

By changing the current amplification factors respectively of the drivers, the switching noise can be reduced. In the conventional technique, however, an outside gate resistor is used in order to alter the switching time $t_{sw}$. Since the gate resistor suppresses the gate current over the switching time $t_{sw}$, the switching speed is lowered uniformly during the switching. This brings about a result that the switching loss is increased. On the contrary, according to the present embodiment, it is possible to change the current amplification factors respectively of the drivers and alter the switching speed over only a partial interval in the switching time without using an outside gate resistor. In other words, in the present embodiment, noise can be suppressed effectively by altering the switching speed during the switching. For example, by lowering the switching speed immediately before the drain current completely rises, noise can be suppressed effectively.

The ON resistance $R_{DS(ON)}$ is lowered by increasing the number of cells connected in parallel in the transistor. Since the cells are connected in a transistor in parallel, however, an increase in the number of cells causes an increase in capacitance of the gate electrode. If the capacitance of the gate electrode increases, the switching time $t_{sw}$ becomes slow. Therefore, the ON resistance $R_{DS(ON)}$ and the switching time $t_{sw}$ are in a trade-off relation with respect to the number of cells connected in parallel.

Figure 5:
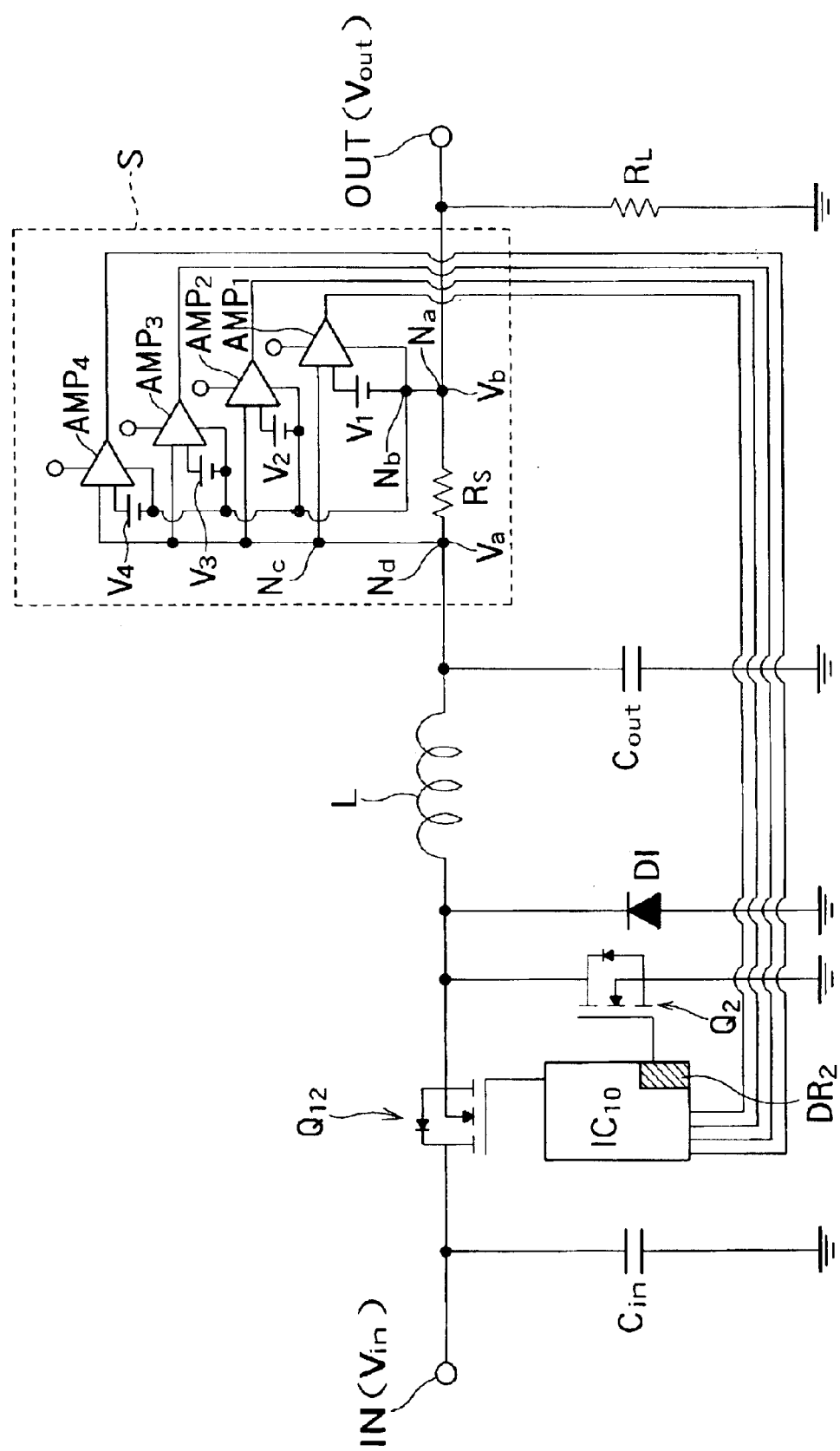
FIG. 5 is a circuit diagram showing a DC—DC converter of a first embodiment according to the present invention.

Heretofore, a large number of attempts to improve the trade-off relation have been made. However, the present inventors have focused on the transitional phenomenon that the inductance, capacitance and resistance are equivalent. In the present embodiment based on this, a plurality of drivers 30 are arranged distributively in the cell array. As a result, the resistance and inductance of aluminum wiring can be reduced. According to the present embodiment, even if the capacitance of the gate electrode 24 is increased in order to reduce the ON resistance $R_{DS(ON)}$, the increase in the switching time $t_{sw}$ can be suppressed by reducing the resistance and inductance of the aluminum wiring. According to the present embodiment, therefore, the trade-off between the ON resistance $R_{DS(ON)}$ and the switching time $t_{sw}$ can be improved without altering the capacitance of the gate electrode 24, and consequently the power loss P can be decreased. As a result, it is possible to improve the conversion efficiency of a power supply in a DC—DC converter as shown in FIG. 5 and reduce the power dissipation of the electronic apparatus.

Figure 2:
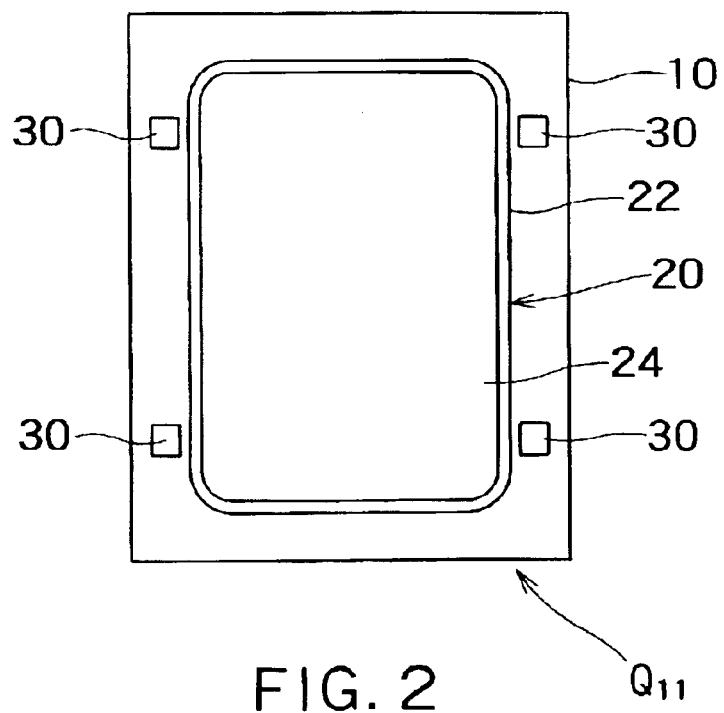
FIG. 2 is a top view showing a transistor $Q_{11}$ in a second embodiment of a power switching device according to the present invention.

FIG. 2 is a top view of a power MISFET $Q_{11}$ (hereafter also referred to as transistor $Q_{11}$) in a second embodiment of a power switching device according to the present invention. The transistor $Q_{11}$ is different from the transistor $Q_{10}$ in that the drivers 30 are mounted on the frame 10. The drivers 30 may be formed as a driver chip manufactured separately from the semiconductor chip 20. The remaining configuration of the transistor $Q_{11}$ is the same as that of the transistor $Q_{10}$. In the present embodiment, the drivers 30 are arranged so as to make the center of gravity of the four drivers 30 nearly coincide with the center of gravity of all cells, in the same way as the transistor $Q_{10}$.

According to the present embodiment, the drivers 30 do not exist in the cell array. As compared with the first embodiment, therefore, a larger number of cells can be provided in the semiconductor chip 20. In addition, the same effects as those in the case of the transistor $Q_{10}$ can be obtained.

Figure 3:
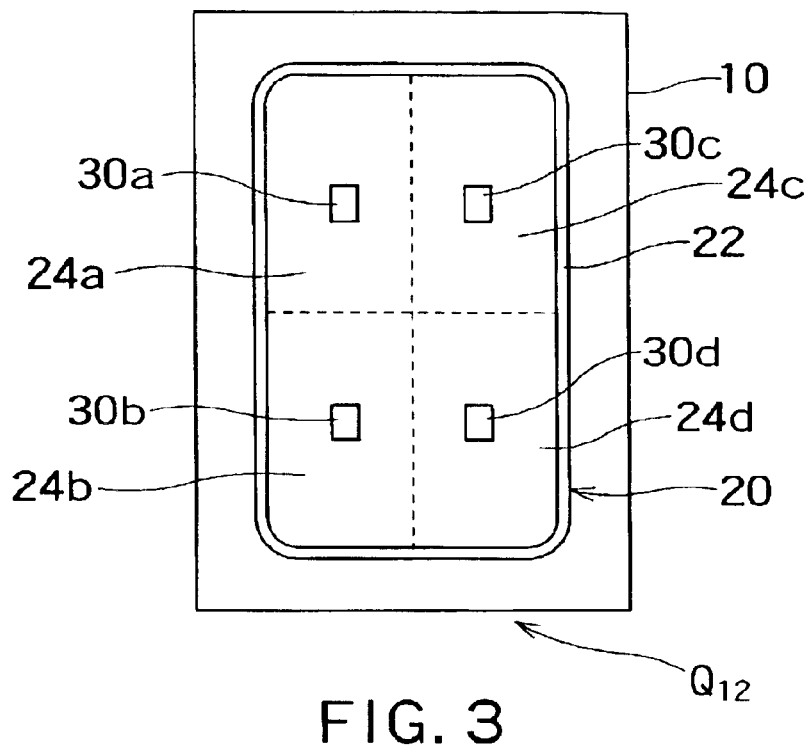
FIG. 3 is a top view showing a transistor $Q_{12}$ in a third embodiment of a power switching device according to the present invention.
Figure 4:
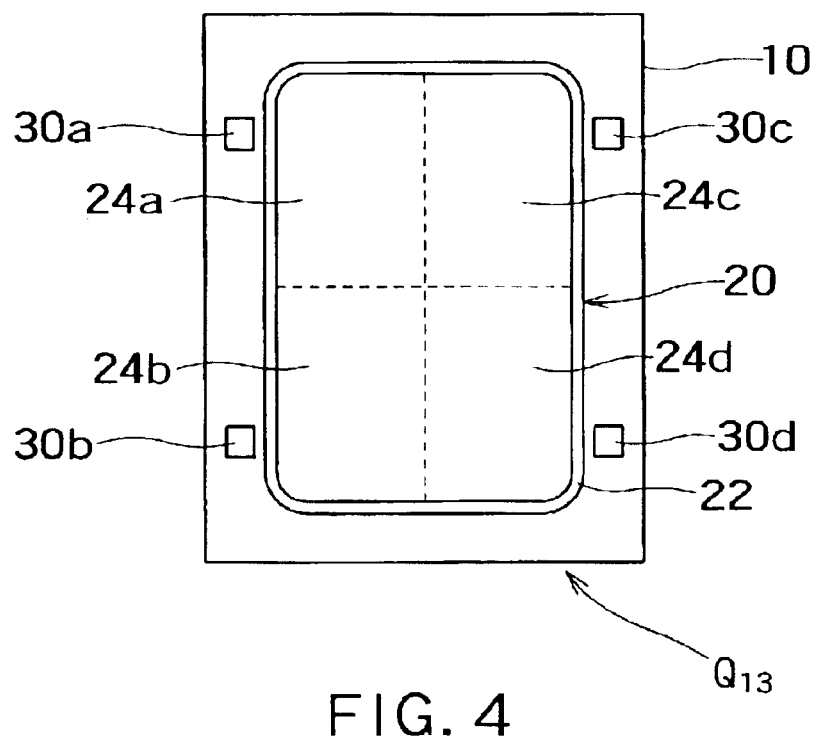
FIG. 4 is a top view showing a transistor $Q_{13}$ in a fourth embodiment of a power switching device according to the present invention.

FIG. 3 is a top view of a power MISFET $Q_{12}$ (hereafter also referred to as transistor $Q_{12}$) in a third embodiment of a power switching device according to the present invention. The present embodiment differs from the first embodiment in that the gate electrode is divided into 24a, 24b, 24c and 24d. The gate electrodes 24a, 24b, 24c and 24d are electrically insulated from each other. In FIGS. 3 and 4, separated regions of the gate electrodes 24a to 24d are represented by broken lines. The gate electrodes 24a, 24b, 24c and 24d are connected to drivers 30a, 30b, 30c and 30d, respectively. The drivers 30a to 30d are disposed nearly in the centers of the gate electrodes 24a to 24d in order to reduce the resistance and inductance of the aluminum wiring. The remaining configuration of the present embodiment is the same as that of the first embodiment.

According to the present embodiment, in the case where voltages are supplied to the gate electrodes 24a to 24d respectively by the drivers 30a to 30d at the same timing, its operation is conducted in the same way as the first embodiment.

On the other hand, in the case where voltages are supplied to the gate electrodes 24a to 24d respectively by the drivers 30a to 30d at different timing, the drivers 30a to 30d can drive only cells located under the gate electrodes 24a to 24d, respectively.

In general, in the case where a DC—DC converter of synchronous commutation type conducts high-speed operation, the power loss P of the power MOS transistor used therein is mainly the sum of the ON resistance loss (stationary loss) and the switching loss. Denoting the ON resistance of the power MOS transistor by $R_{DS(ON)}$ and the switching time of the power MOS transistor by $t_{sw}$, the power loss P can be typically represented by expression (1).

$$P = I_D V_{in} t_{sw} f + I_D^2 R_{DS(ON)} \frac{V_{out}}{V_{in}} \geq 2 \sqrt{I_D V_{in} t_{sw} f \times I_D^2 R_{DS(ON)} \frac{V_{out}}{V_{in}}} \quad (1)$$

$I_D$ is a drain current, and f is an operation frequency of the DC—DC converter. The switching loss is represented by expression (2), and the ON resistance loss is represented by expression (3).

$$I_D V_{in} t_{sw} f \quad (2)$$

$$I_D^2 R_{DS(ON)} \frac{V_{out}}{V_{in}} \quad (3)$$

When the switching loss is equal to the ON resistance loss, i.e., the following expression (4) is satisfied, equality in the expression (1) is satisfied and the power loss P becomes an minimum value. Satisfaction of the expression (4) becomes an optimum condition for the DC—DC converter.

$$I_D V_{in} t_{sw} f = I_D^2 R_{DS(ON)} \frac{V_{out}}{V_{in}} \quad (4)$$

If the drain current $I_D$, the input voltage $V_{in}$, the output voltage $V_{out}$, and the operation frequency f of the DC—DC converter are given, then the ratio of the ON resistance $R_{DS(ON)}$ to the switching time $t_{sw}$ satisfying the expression (4) is determined.

After being manufactured, the conventional transistor $Q_1$ has a constant activated area. Therefore, the resistance, inductance and capacitance of the gate electrode also become constant. The activated area and the resistance, inductance and capacitance of the gate electrode are primary factors that determine the ON resistance $R_{DS(ON)}$ and the switching time $t_{sw}$. Therefore, the one transistor $Q_1$, can provide only one optimum condition for a certain load $R_L$. In other words, the conventional transistor $Q_1$ cannot provide an optimum condition corresponding to the change of the load $R_L$.

On the other hand, the present embodiment can alter the activated area by controlling the operation of the drivers 30a to 30d. As a result, the ON resistance $R_{DS(ON)}$ and the switching time $t_{sw}$ can be adjusted so as to satisfy the expression (4).

In addition, the present embodiment has the same effects as those of the first embodiment.

FIG. 4 is a top view of a power MISFET $Q_{13}$ (hereafter also referred to as transistor $Q_{13}$) in a fourth embodiment of a power switching device according to the present invention.

The present embodiment differs from the second embodiment in that the gate electrode is divided into 24a, 24b, 24c and 24d. The gate electrodes 24a, 24b, 24c and 24d are electrically insulated from each other. The gate electrodes 24a, 24b, 24c and 24d are connected to drivers 30a, 30b, 30c and 30d, respectively. The remaining configuration of the present embodiment is the same as that of the second embodiment.

The present embodiment has the effects of both the second embodiment and the third embodiment.

Each of the first to fourth embodiments of a power switching device may be a power MOSFET or an IGBT. Each of these power switching devices may be either of a P-type FET and an N-type FET.

The number of drivers 30 is not limited. In the third and fourth embodiments, the number of the drivers 30 is equal to the number of the gate electrodes 24.

In these embodiments, the drivers 30 are arranged so as to make the center of gravity of all drivers 30 nearly coincide with the center of gravity of all cells, in order to decrease the resistance and inductance of aluminum wiring. However, the drivers 30 may be arranged freely so long as current scan be supplied to the gate electrodes 24 efficiently.

FIG. 5 is a circuit diagram showing a DC—DC converter of a first embodiment of according to the present invention. A DC—DC converter 100 of the present embodiment includes a transistor $Q_{12}$, a control circuit $IC_{10}$, and a detection circuit S. The transistor $Q_{12}$ is connected between an input IN and output OUT. The transistor $Q_{12}$ is shown in FIG. 3. In the embodiment shown in FIG. 5 or FIG. 7, the transistor $Q_{13}$ shown in FIG. 4 may be used instead of the transistor $Q_{12}$.

The control circuit $IC_{10}$ controls a plurality of drivers 30 provided in the transistor $Q_{12}$. Since the drivers 30 are provided in the transistor $Q_{12}$, the control circuit $IC_{10}$ does not have the driver $DR_1$. The control circuit $IC_{10}$ controls the drivers 30 to switch the transistor $Q_{12}$ at a high frequency.

The detection circuit S includes a detection resistor Rs connected in series between the input IN and the output OUT. The detection resistor Rs is provided near the output OUT. In addition, the detection circuit S includes sense amplifiers $AMP_1$ to $AMP_4$ connected in parallel with the detection resistor RS. The sense amplifiers $AMP_1$ to $AMP_4$ are connected in parallel with each other. First inputs of the sense amplifiers $AMP_1$ to $AMP_4$ are connected to an input IN side end of the detection resistor Rs. Second inputs of the sense amplifiers $AMP_1$ to $AMP_4$ are connected to an output OUT side end of the detection resistor Rs via voltage sources $V_1$ to $V_4$, respectively. Outputs of the sense amplifiers $AMP_1$ to $AMP_4$ are connected to the control circuit $IC_{10}$.

The sense amplifiers $AMP_1$ to $AMP_4$ are provided respectively for a plurality of drivers 30 included in the transistor $Q_{12}$, in one-to-one correspondence. In the present embodiment, therefore, the number of sense amplifiers $AMP_1$ to $AMP_4$ is equal to the number of the drivers 30.

The detection circuit S detects a current that flows through the detection resistor Rs, i.e., a current that flows through the transistor $Q_{12}$, and feeds back a result of the detection to the control circuit $IC_{10}$.

Operation of the detection circuit S will now be described in more detail. If the current that flows through the detection resistor Rs becomes large, then the potential difference across the detection resistor Rs becomes large. A voltage at an input IN side end of the detection resistor Rs is denoted by Va, and a voltage at an output OUT side end of the detection resistor Rs is denoted by Vb. When a potential difference between the voltage Va and the voltage Vb has exceeded the voltage $V_1$, the sense amplifier $AMP_1$ feeds back a detected signal to the control circuit $IC_{10}$. On the basis of this detected signal, the control circuit $IC_{10}$ activates one driver 30 included in the plurality of drivers 30 and corresponding to the sense amplifier $AMP_1$. In the same way, when the potential difference between the voltage Va and the voltage Vb has exceeded the voltage $V_2$ to the voltage $V_4$, the sense amplifiers $AMP_2$ to $AMP_4$ feed back a detected signal to the control circuit $IC_{10}$, respectively. On the basis of these detected signals, the control circuit $IC_{10}$ activates drivers 30 respectively corresponding to the sense amplifiers $AMP_2$ to $AMP_4$.

Further, when the potential difference between the voltage Va and the voltage Vb has fallen below the voltage $V_1$ to the voltage $V_4$, the sense amplifiers $AMP_1$ to $AMP_4$ feed back a detected signal to the control circuit $IC_{10}$, respectively. On the basis of these detected signals, the control circuit $IC_{10}$ stops drivers 30 respectively corresponding to the sense amplifiers $AMP_1$ to $AMP_4$.

In this way, the DC—DC converter 100 can control the drivers 30 provided in the transistor $Q_{12}$, independently. On the other hand, by making the voltages $V_1$ to $V_4$ equal to each other, the DC—DC converter 100 can control the drivers 30 provided in the transistor $Q_{12}$ simultaneously.

In the case where control is conducted by using frequency modulation, a change in operation frequency of the transistor $Q_{12}$ causes a change in current that flows through the transistor $Q_{12}$, i.e., in current that flows through the detection resistor Rs. The detection circuit S detects a current change caused by a change in operation frequency, and sends a detected signal to the control circuit $IC_{10}$. The control circuit $IC_{10}$ can control the drivers 30 on the basis of the detected signal.

For example, in the case where the operation frequency has risen, the control circuit $IC_{10}$ turns some of drivers 30 off to reduce the number of activated cells. As a result, the ON resistance $R_{DS(ON)}$ increases and the switching time $t_{sw}$ becomes short. On the other hand, in the case where the operation frequency has fallen, the control circuit $IC_{10}$ increases the number of activated drivers 30. As a result, the ON resistance $R_{DS(ON)}$ decreases and the switching time $t_{sw}$ becomes long. It thus becomes possible to adjust the ratio of the ON resistance $R_{DS(ON)}$ to the switching loss. In the present embodiment, therefore, the expression (4) can be satisfied even if the operation frequency changes.

For example, the current that flows through the power MISFET $Q_{12}$ or $Q_{13}$ used for a DC—DC converter in a personal computer increases in the case where the load is large, such as when a CPU is processing information or an HDD (Hard Disk Drive) is rotating at high speed. As represented by the expression (2) and the expression (3), the switching loss is a linear function of the current $I_D$, and the ON resistance loss is a quadratic function of the current $I_D$. Therefore, the proportion of the ON resistance loss in the power loss P increases as compared with the proportion of the switching loss. In this case, the number of activated cells is increased by increasing the number of activated drivers 30. As a result, adjustment can be conducted so as to make the ON resistance loss equal to the switching loss. Thus, in the present embodiment, the expression (4) can be satisfied by altering the number of the activated drivers 30.

Figure 6A:
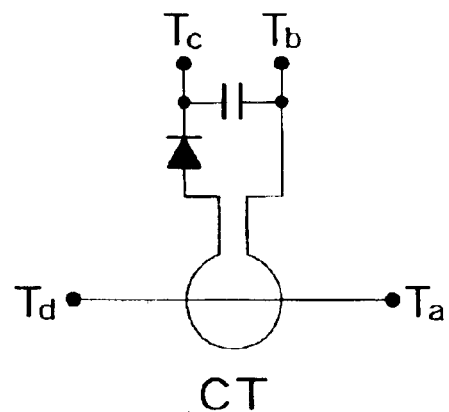
FIG. 6A is circuit diagrams of a CT, which can be used instead of a detection resistor Rs.
Figure 6B:
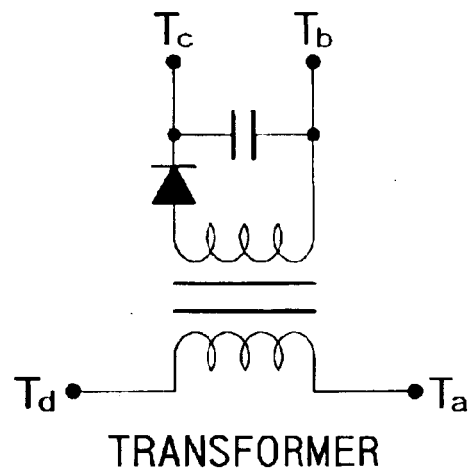
FIG. 6B is circuit diagrams of a transformer, which can be used instead of a detection resistor Rs.
Figure 6C:
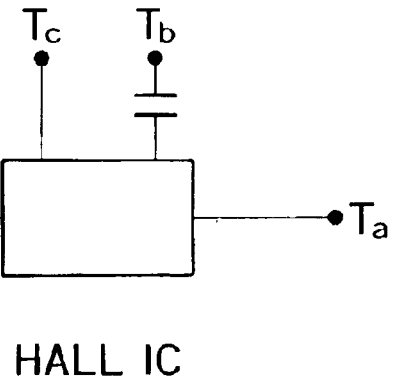
FIG. 6C is circuit diagrams of a Hall IC, which can be used instead of a detection resistor Rs.

In the present embodiment, a CT (Current Transformer) a transformer, or a Hall IC can be used instead of the detection resistor Rs. FIGS. 6A to 6C show embodiments of the CT, the transformer, and the Hall IC, respectively. In the case where the CT, the transformer, or the Hall IC is used, terminals Ta, Tb, Tc and Td shown in one of FIGS. 6A to 6C may be respectively connected to nodes Na, Nb, Nc and Nd shown in FIG. 5 instead of wiring between the nodes Na and Nb, wiring between the nodes Nc and Nd, and wiring between the nodes Na and Nd containing the detection resistor Rs. These variants also have effects of the embodiment shown in FIG. 5.

Figure 7:
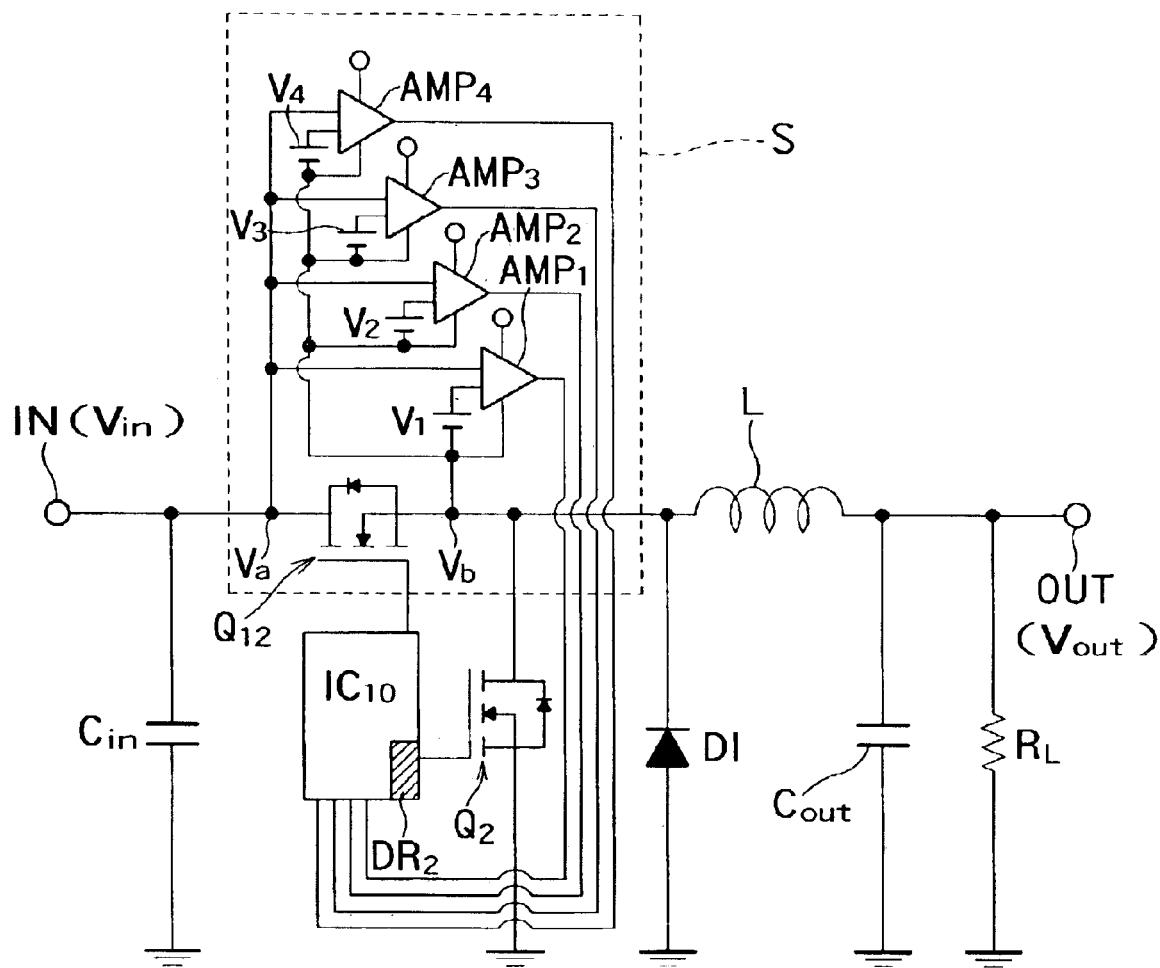
FIG. 7 is a circuit diagram showing a DC—DC converter of a second embodiment according to the present invention.

FIG. 7 is a circuit diagram showing a second embodiment of a DC—DC converter according to the present invention. A DC—DC converter 200 in the present embodiment differs from the DC—DC converter 100 in that the detection resistor is not provided and the detection circuit S directly detects a current that flows through the transistor $Q_{12}$.

The detection circuit S in the present embodiment includes sense amplifiers $AMP_1$ to $AMP_4$ connected in parallel with the transistor $Q_{12}$. The sense amplifiers $AMP_1$ to $AMP_4$ are connected in parallel with each other. First inputs of the sense amplifiers $AMP_1$ to $AMP_4$ are connected to the transistor $Q_{12}$ at its drain. Second inputs of the sense amplifiers $AMP_1$ to $AMP_4$ are connected to the transistor $Q_{12}$ at its source via the voltage sources $V_1$ to $V_4$, respectively. The remaining configuration of the present embodiment is the same as that of the DC—DC converter 100 shown in FIG. 5.

There is a resistance component between the source and the drain of the transistor $Q_{12}$. If the current that flows between the source and the drain of the transistor $Q_{12}$ becomes large, then the potential difference between the source and the drain becomes large. The detection circuit S feeds back a detected signal to the control circuit $IC_{10}$ on the basis of the potential difference. The remaining operation of the present embodiment is the same as that of the DC—DC converter 100 shown in FIG. 5.

According to the present embodiment, the detection resistor Rs is not necessary. In addition, the present embodiment has the same effects as those of the first embodiment shown in FIG. 5.

Figure 8:
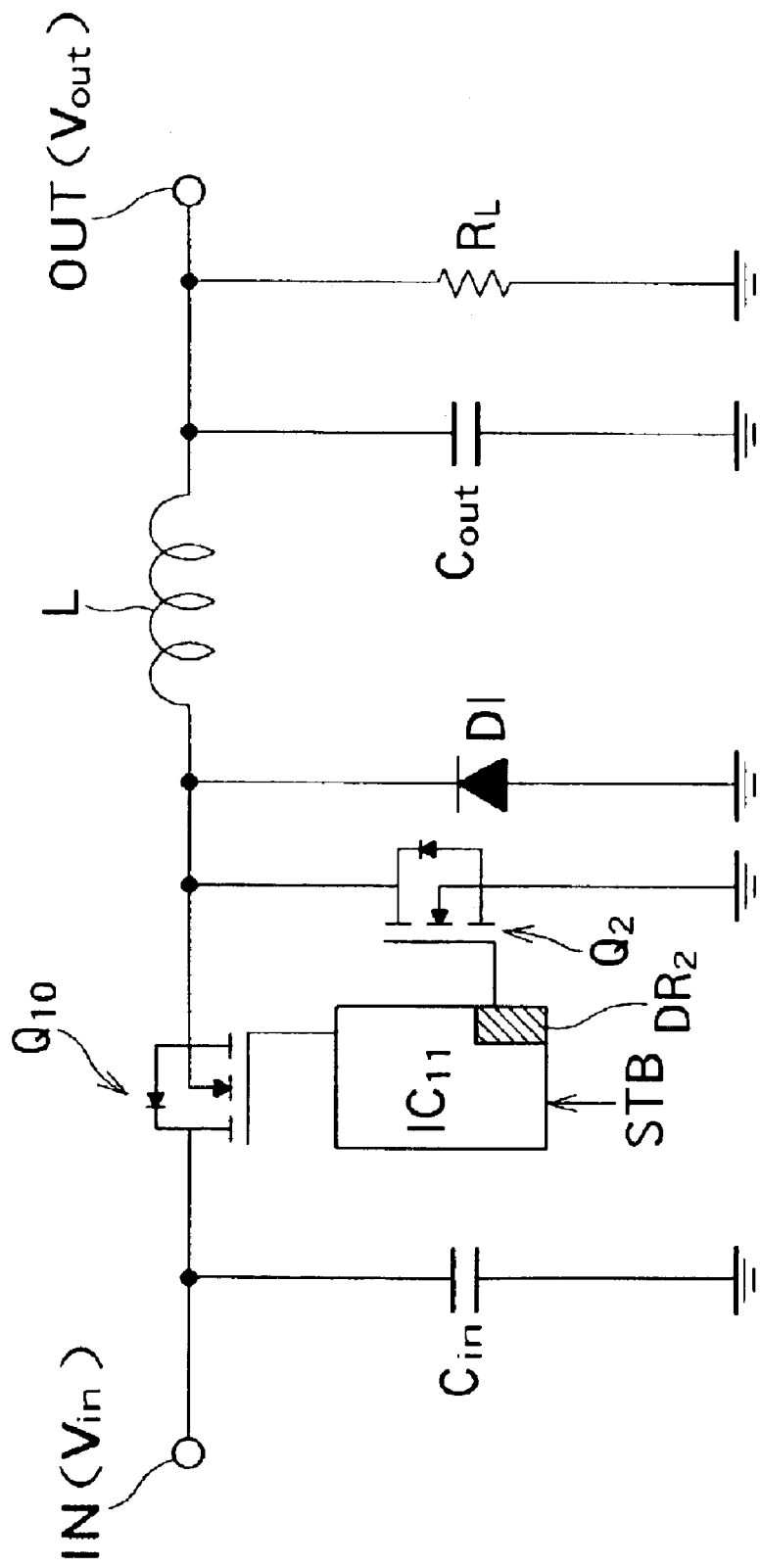
FIG. 8 is a circuit diagram showing a DC—DC converter of a second embodiment according to the present invention.

FIG. 8 is a circuit diagram showing a third embodiment of a DC—DC converter according to the present invention. A DC—DC converter 300 in the present embodiment differs from the DC—DC converters 100 and 200 in that the detection circuit S is not provided and a control circuit $IC_{11}$ controls the drivers 30 in the transistor $Q_{10}$ on the basis of the operation frequency or the pulse width.

The control circuit $IC_{11}$, controls the drivers 30 on the basis of the operation frequency or the pulse width. In the present embodiment, therefore, the ratio of the ON resistance loss to the switching loss can be adjusted on the basis of the operation frequency f (see the expression (2)) or the pulse width, in the same way as the DC-DC converter 100. In other words, in the present embodiment, the expression (4) can be satisfied even if the current is changed on the basis of the operation frequency f or the pulse width.

The control circuit $IC_{11}$ is supplied with a standby signal STB, and the control circuit $IC_{11}$ can control the transistor $Q_{10}$ on the basis of the signal STB. For example, if the load is in the standby state, then the control circuit $IC_{11}$ reduces the number of activated drivers 30 and reduces the number of activated cells. As a result, the leak current from the gate electrode 24 at the time of load standby can be suppressed.

In the present embodiment, any one of the transistors $Q_{11}$, $Q_{12}$ or $Q_{13}$ may be used instead of the transistor $Q_{10}$.

The power switching devices in the embodiments heretofore described can conduct switching operation at high speed.

What is claimed is:

1. A power switching device comprising:
  a semiconductor substrate;
  a plurality of cells, each of which switches a current from a power supply to a load on the basis of a potential at a gate electrode, said cells being arranged on said semiconductor substrate to form a cell array; and
  a plurality of drivers connected to the gate electrode, said plurality of drivers being distributively arranged in said cell array or being distributively arranged peripheral said cell array.

2. The power switching device according to claim 1, wherein said plurality of drivers are arranged so as to make a center of gravity of said plurality of drivers coincide with a center of gravity of said plurality of cells.

3. The power switching device according to claim 1, wherein the gate electrode connected to any driver included in said plurality of drivers is electrically insulated from the gate electrodes connected to other drivers.

4. The power switching device according to claim 3, further comprising a control circuit configured to decrease the number of activated drivers included in said plurality of drivers when an operation frequency of the power switching device rises.

5. The power switching device according to claim 3, further comprising a control circuit configured to increase the number of activated drivers included in said plurality of drivers when a current that flows through the power switching device increases.

6. The power switching device according to claim 3, wherein each of said plurality of drivers is positioned substantially in a center of a gate electrode connected to the driver.

7. The power switching device according to claim 3, wherein said plurality of drivers are driven simultaneously.

8. The power switching device according to claim 3, wherein each of said plurality of drivers is driven independently.

9. A power switching device comprising:
  a switching circuit including a semiconductor substrate, a plurality of cells, each of which switches a current from a power supply to a load on the basis of potential at a gate electrode, said cells being arranged on said semiconductor substrate to form a cell array, and a plurality of drivers connected to the gate electrode, said a plurality of drivers being distributively arranged in said cell array or being distributively arranged peripheral said cell array; and
  a control circuit to control said plurality of drivers on the basis of an operation frequency of said switching circuit.

10. The power switching device according to claim 9, wherein said plurality of drivers are arranged so as to make a center of gravity of said plurality of drivers coincide with a center of gravity of said plurality of cells.

11. The power switching device according to claim 9, wherein the gate electrode connected to any driver included in said plurality of drivers is electrically insulated from the gate electrodes connected to other drivers.

12. The power switching device according to claim 11, wherein when an operation frequency of the power switching device rises, said control circuit decreases the number of activated drivers included in said plurality of drivers.

13. The power switching device according to claim 11, wherein each of said plurality of drivers is positioned substantially in a center of a gate electrode connected to the driver.

14. The power switching device according to claim 9, wherein said plurality of drivers are driven simultaneously.

15. The power switching device according to claim 9, wherein each of said plurality of drivers is driven independently.

\* \* \* \* \*